United States Patent [19]

Feldstein

[11] 4,136,216

[45] * Jan. 23, 1979

[54] NON-PRECIOUS METAL COLLOIDAL DISPERSIONS FOR ELECTROLESS METAL DEPOSITION

[75] Inventor: Nathan Feldstein, Princeton, N.J.

[73] Assignee: Surface Technology, Inc., Princeton, N.J.

[ * ] Notice: The portion of the term of this patent subsequent to Nov. 23, 1993, has been disclaimed.

[21] Appl. No.: 731,212

[22] Filed: Oct. 12, 1976

Related U.S. Application Data

[60] Division of Ser. No. 607,506, Aug. 26, 1975, Pat. No. 3,993,799, which is a continuation-in-part of Ser. No. 512,224, Oct. 4, 1974, abandoned.

[51] Int. Cl.² .................................................. C23C 3/02
[52] U.S. Cl. .................................... 427/306; 427/304; 427/305; 106/1.11
[58] Field of Search ....................... 427/304, 305, 306; 252/317, 363.5; 106/1.11

[56] References Cited

U.S. PATENT DOCUMENTS

| | | | |
|---|---|---|---|
| 1,976,920 | 10/1934 | Christiansen et al. | 252/317 |
| 2,273,643 | 2/1942 | Hurd | 252/317 |
| 3,657,003 | 4/1972 | Kenney | 427/430 |
| 3,793,072 | 2/1974 | Lando | 427/98 |
| 3,958,048 | 5/1976 | Donovan et al. | 427/304 |
| 3,993,799 | 11/1976 | Feldstein | 427/306 X |

FOREIGN PATENT DOCUMENTS

| | | | |
|---|---|---|---|
| 2335497 | 2/1974 | Fed. Rep. of Germany | 427/306 |
| 2192189 | 2/1974 | France | 427/306 |
| 1426462 | 2/1976 | United Kingdom | 427/306 |

*Primary Examiner*—Ralph S. Kendall
*Attorney, Agent, or Firm*—Joel F. Spivak; Stanley Lieberstein

[57] ABSTRACT

Metallic surfaces are imparted to non-conductive or dielectric substrates by an electroless coating process comprising coating the surface of the substrate with a hydrous oxide colloid of non-precious metal ions preferably selected from the group consisting of cobalt, nickel and copper ions, reducing the selected metal ions to a reduced or zero valence state with a suitable reducing agent, and exposing the substrate to an electroless plating bath.

45 Claims, No Drawings

NON-PRECIOUS METAL COLLOIDAL DISPERSIONS FOR ELECTROLESS METAL DEPOSITION

REFERENCE TO PRIOR APPLICATION

This application is a division of Ser. No. 607,506, filed Aug. 26, 1975, now U.S. Pat. No. 3,993,799, which is a Continuation-In-Part of U.S. application Ser. No. 512,224, filed Oct. 4, 1974, now abandoned.

BACKGROUND OF THE INVENTION

Electroless or autocatalytic coating of dielectric surfaces is a well-known process finding wide-spread utility in the preparation of such diverse articles as printed circuits, automotive trim, etc.

The normal commercial electroless coating process involves an initial etching of the dielectric substrate by physical or chemical means to improve adherence of the metallic coating. The etching surface is then sensitized by treatment with a solution of stannous ions, e.g., a stannous chloride solution, and then activated by treatment with a solution of palladium chloride. Generally, after etching, most substrates are hydrophillic. Activation is effected by reduction of the palladium ions to the zero valence state by the stannous ions to form palladium metal sites or by formation of a tin/palladium complex on the surface.

In the U.S. Pat. No. 3,011,920, issued Dec. 5, 1961, to Shipley, an alternative process for preparing the substrate prior to electroless coating is described in which the noble metal, e.g., palladium, is applied directly to the dielectric substrate in the form of a colloidal solution containing the metal in the zero valence state. Normally, the metal is formed in the colloidal solution by introducing both palladium chloride and stannous chloride into the solution, the palladium ions being reduced within the solution to the zero valence state by the stannous ions, or by formation of a tin/palladium complex on the surface. In processing an article with this type of catalyst (composed of $SnCl_2$ and $PdCl_2$), following a rinse step, an immersion into an accelerator solution is carried out. Typical accelerator solutions are composed of diluted acid such as fluoroboric acid.

Another procedure is described in U.S. Pat. No. 3,783,005, issued Jan. 1, 1974, to Kenney, wherein the sensitizing ions, e.g., stannous ions, are coated onto the substrate first treated by using hydrous oxide colloids of the type described in U.S. Pat. No. 3,657,003, issued Apr. 18, 1972, to Kenney. More specifically, the process described therein comprises forming a hydrous oxide colloid containing stannous ions, either as the hydrous oxide or in combination with the hydrous oxide of another metal, coating the dielectric substrate with the colloid, and thereafter activating the substrate with a solution of palladium or other noble metal ions, the palladium ions being converted to palladium metal by the stannous ions in the colloid. The hydrous oxide colloid used in promoting the stannous ion adsorption to the surface is unchanged in its oxidation state. As an alternative process, Kenney describes activating the surface with a one-step sensitizer-activator solution in which a noble metal ion colloid is applied to the untreated surface and then reduced to the zero valence state.

A similar disclosure of a one-step sensitizer-activator process using palladium is disclosed by F. Pearlstein in Metal Finishing, 53, (8), 59 (1955).

Processes of the above nature utilizing tin/palladium systems have inherent technical and economic disadvantages. Specifically, precious metals in such systems generally exhibit a low overvoltage for hydrogen gas evolution, often resulting in excess hydrogen gas evolution during the electroplating step yielding deposits of poor integrity and porosity which are thus susceptible to chemical attack and poor adhesion. Furthermore, precious metal ions in solution, when brought into contact with metallic surfaces, e.g., copper surfaces, tend to displace the metallic surface and be deposited by a chemical displacement reaction. Such effect is costly and often tends to produce poor adherent conditions. In some cases, too much palladium is deposited, leading to over-catalyzation. See D. Grabbe, "Multilayer board plated-thru-hole Failure Mechanisms," 10th Ann. Proc. Reliability Physics, (IEEE), 1972. Furthermore, such systems cause contamination of the electroless plating baths with palladium, resulting in non-uniform coating and necessitating frequent replacing of the electroless plating baths, high operating costs because of the required use of noble metal ions, and increased costs resulting from the necessity of employing a stabilizer in such baths to inhibit oxidation and hydrolytic reactions of the stannous ions.

The aforesaid disadvantages attendant in the use of palladium or other noble metals are overcome by the process described in copending and commonly assigned U.S. application Ser. No. 521,901, now U.S. Pat. No. 3,993,491 filed Nov. 8, 1974 as a continuation-in-part of U.S. application Ser. No. 422,774, filed Dec. 7, 1973, now abandoned. In the process described therein, the dielectric substrate is treated with stannous and copper ions, either simultaneously or in sequence, the ions then being reduced to a lower oxidation state by treatment with a reducing agent. The substrate is then electrolessly coated by conventional procedures.

Another system utilizing non-precious metal ions is described in U.S. Pat. Nos. 3,772,056 and 3,772,078 to Polichette et al. In the systems described therein, the dielectric substrate to be plated is immersed in a solution of non-precious metal ions, and then dried to promote adherence of the ions to the dielectric surface. The ions may then be reduced to the metallic state by heat or chemical means. A system of this nature is a significant departure from the standard commercial process as a result of the required intermediate drying step to achieve the required adhesion. In standard commercial processes, the article to be plated is passed from one aqueous treating tank to another with intermediate rinsing steps to remove excessive material. A procedure of this nature is essential due to the automation of most plating operations and would require a major modification in standard equipment and procedures, thus rendering the process unattractive and costly. A process for electroless plating, to be commercially feasible must be adaptable to commercial processing techniques.

There is a need for electroless plating compositions and processes overcoming the aforesaid disadvantages while still being compatible with commercial procedures. The present invention provides such compositions and processes.

SUMMARY OF THE INVENTION

It is the principle object of the present invention to provide an effective and economical process for preparing dielectric substrates for electroless coating or plating of a metallic surface thereon, and to provide an electroless coating process including such preparation.

It is a particular object of the present invention to provide a process for preparing dielectric substrates for electroless plating which does not involve the use of stannous ions, thus avoiding the disadvantages attendant in such use. It is yet another object to provide a process of the nature in which the necessity of using noble metals is eliminated.

It is another object of the present invention to provide improved compositions for use in the electroless plating of dielectric substrates.

It is another object of the present invention to provide compositions and processes for the electroless plating of dielectric substrates which are compatible with commercial procedures. Other objects of the present invention, if not specifically set forth herein, will be apparent to the skilled artisan upon the reading of the detailed description of the invention which follows.

Surprisingly, it has been discovered that the aforesaid objectives may be achieved by a process comprising the coating of a dielectric substrate, which has preferably first been etched by conventional means to improve adherence, with a hydrous oxide colloid of non-precious metal ions preferably selected from the group consisting of copper, nickel and cobalt followed by reduction to a reduced or elemental state with a suitable reducing agent to activate the surface for subsequent electroless coating.

DETAILED DESCRIPTION OF THE INVENTION

The process of the present invention is applicable to the metallic plating of a wide variety of dielectric substrates, but will normally be employed commercially in the metallic plating of plastics such as ABS. Other dielectric substrates described in the prior art, including thermoplastic and thermosetting resins and glass, may also be suitably plated in accordance with the present invention. Normally, these substrates will be etched, e.g., by treatment with a solution of chromium oxide and sulfuric acid, prior to plating in order to improve adherence of the metallic coating.

The term "hydrous oxide" as used herein, is intended to encompass the insoluble oxides, insoluble hydroxides, insoluble oxides-hydroxides or insoluble mixtures of oxides and hydroxides of metals preferably selected from the group consisting of cobalt, nickel, copper, and mixtures thereof.

It is also recognized that metallic colloids (e.g., copper and nickel and alloys) due to their pyrophoric nature when in contact with air and water are readily metallic nuclei with an outer surface which is oxidized. Due to the catalytic phenomenon on hand it is the surface properties which are of greatest interest. Hence, it should be recognized that in the use of pyrophoric metallic particles for the present catalytic solutions, they may be considered hydrous oxide colloids, and such use falls within the spirit of this invention.

The hydrous oxide colloids of the present invention are generally prepared by adding the selected element or a salt thereof e.g., the sulfate nitrate or acetate salt, to an aqueous medium to produce an aqueous solution. Next a hydrolysis and nucleation reaction is permitted or caused to take place at a controlled rate until the hydrous oxide is formed in situ, the hydrous oxide exceeding the solubility limits of the solution, thus forming a colloid. As is well known in the prior art, the pH of the aqueous medium, preferably formed using deionized water, is adjusted to prevent precipitation or flocculation. The formation of hydrous oxides is well known in the prior art as exemplified by *Inorganic Colloid Chemistry* by H. B. Weiser, Vol. II, John Wiley and Sons, Inc., New York (1935); *Inorganic Chemistry, An Advance Textbook*, by T. Moeller, John Wiley and Sons, Inc., New York (1952); and U.S. Pat. No. 3,657,003.

One approach for the production of hydrous oxide colloid has been described in U.S. Pat. No. 2,438,230; however, such approach while it is simple to implement does not provide a great freedom with respect to selectivity of colloid formed and their properties as those produced by the precipitation technique. U.S. Pat. No. 3,635,668 describes a process for the production of copper hydrate suitable for use as a fungicide. For instance U.S. Pat. No. 3,082,103 demonstrates a universal milling technique by which finely divided oxides may be formed. It should also be noted that while most of the examples in the above reference are directed to formation of the colloidal solutions via precipitation techniques, the present invention is not limited to this approach. Specifically, primer catalytic colloidal solutions may also be prepared by the dissolution and stabilization of properly prepared oxides or hydroxide powders. Hence the manner by which the chemical components are used in preparing said colloidal primer catalytic solutions is a matter of convenience, e.g., shipping costs. The precipitation technique in producing the catalytic media is believed however to possess certain advantages. Specifically, this technique is potentially capable of producing colloids of varied size, shape, and chemical make-up. This freedom in features is especially useful with respect to the subsequent catalytic properties desired. In the event that the colloids are prepared by a precipitation technique, it is further recommended that after centrigugation, washing and redispersion in pure water be undertaken thereby removing extraneous ionic species and insuring a media with low ionic strength. In use, it is also recommended that mild agitation (mechanical, gas dispersion and thermal) be applied to the solution composed of the colloidal particles.

The stability of the above colloidal solutions may be enhanced by various techniques, e.g., dialysis, repetitive centrifugation and washings, as well as by the addition of various materials, referred to herein as stabilizers. The term stabilizer being used to generally describe substrates believed to be adsorbed onto the colloids thereby altering the charge characteristics of said colloids and thus preventing their coagulation.

Stabilizers contemplated by the present invention include secondary colloids, polyalcohols and sugars which, while themselves do not serve the catalyze the dielectric substrate in this process, are believed to stabilize the active hydrous oxide colloid by an encapsulation mechanism.

Typical secondary colloids are gum arabic, gelatine, agar agar, starch, albumim, hemoglobin, cellulose derivatives such as carboxymethyl cellulose and hydroxypropyl cellulose, N-alkylbeta-aminopropionic acid, carboxymethyl dextran, and the like. Typical sugars include mannitol, sorbitol, dulcitol maltose, and arbinose raffinose.

Surfactants may also be suitably employed as a stabilizer for the hydrous oxide colloids. The surfactant, or surface active agent, as used herein generally refers to substances which are capable of lowering the surface tension of a liquid or the interfacial tension between two liquids. All such substances possess the common feature of a water-soluble (hydrophillic) group attached to an organic (hydrophobic) chain. Surfactants as used herein are also intended to encompass detergents and emulsifying agents.

It is also contemplated that a mixture of surfactants or surfactants with other stabilizers may be used. Care should be exercised in the use of surfactants in the preparation of the present hydrous oxide colloids, as would be noted by anyone skilled in the art, whereas the use of excess surfactants may lead to a charge reversal.

Suitable reducing agents, i.e., developers, for use in the present invention are compositions or compounds which will reduce the non-precious metal, e.g., copper, nickel or cobalt, ions of the hydrous oxide to a lower valence or elemental state. Exemplary of such reducing agents, which are normally employed in the aqeuous state, are dimethylamine borane (DMAB), diethylhydroxylamine, N-alkyl-borazones, borazenes, borazines and mixtures thereof. Of particular utility are the alkail metal and alkaline earth metal borohydrides, such as the potassium and sodium borohydrides.

In general, the electroless coating process of the present invention comprises contacting, e.g., by immersion, the dielectric substrate, preferably previously etched with the hydrous oxide colloid, i.e., the colloidal catalytic solution, washing the substrate with deionized water and then contacting the hydrous oxide colloid adsorbed substrate with the reducing agent to form a discontinous coating of the metal of the reduced oxidation state on the surface of the substrate, thus forming the catalytic nuclei active for the initiation of the electroless process upon subsequent immersion of the substrate in an appropriate electroless plating bath.

More specifically, the improved process of the present invention is comprised of the following sequence of steps followed by electroless plating.

(1) Immersing a dielectric substrate in a solution comprised of a hydrous oxide colloid of a non-precious metal, preferably selected from the group consisting of copper, nickel, cobalt and mixtures thereof.

(2) Rinsing the substrate with water to remove excess colloid;

(3) Immersing the substrate after rinsing in a solution comprised of a reducing agent capable of reducing the metallic ionic portion of the adsorbed colloid to a lower or zero oxidation state; and (4) Optionally rinsing the substrate with water prior to electroless plating.

For the sake of convenience, certain of the examples set forth hereinafter will not refer to the intermediate rinsing step. A rinsing step (step 2) is, in all instances, involved however. In specific instances, it is possible to delete steps 3 and 4 as set forth above by directly immersing the substrate, after rinsing, in an electroless plating solution containing a suitable reducing agent capable of lowering the valence state of the metallic portion of the adsorbed colloid.

In addition to the water employed in steps (2) and (4) of the above process, the objects of the present invention are achieved using the following system of solutions:

(1) A hydrous oxide colloid of a non-precious metal preferably selected from the group consisting of cobalt, nickel and copper and mixtures thereof; and (2) An aqueous solution of a reducing agent which will reduce non-precious metal ions in said colloid following adsorption of said colloid onto the substrate to a lower valence or metallic state.

The following examples are illustrative of the present invention and are not to be take as in limitation thereof.

EXAMPLE I

An ABS substrate was etched in a solution comprised of 400 g/l chromium oxide and 350 g/l concentrated sulfuric acid for approximately four minutes at a temperature of 70° C. Thereafter, the etched substrate was immersed in a primer solution for five minutes, the primer solution being prepared by dissolving one gram of $NiCl_2 \cdot 6H_2O$ in 100 milliliters of deionized water and raising the pH to 6.5 with the slow addition of one molar NaOH. The primed substrate was then rinsed and immersed in a developer solution comprised of one g/l of $KBH_4$ for two minutes. The substrate was then rinsed and immersed in an electroless copper bath at a temperature of 40° C. having the following composition to effect plating:

| | |
|---|---|
| $CuSO_4 \cdot 5H_2O$ | 15 g/l |
| EDTA (40%) | 68 cc/l |
| NaOH | 9 g/l |
| NaCN | 3 ppm |
| Tergitol TMN | 0.2 (wt.%) |
| $H_2CO$ (37%) | 22 c/l |

EXAMPLE II

The electroless plating procedure of Example I was followed with the exception that the primer solution, i.e., the hydrous oxide colloid, was prepared by adding two grams of sucrose and 15 milliliters of one molar ammonium hydroxide to four milliliters of one molar cupric chloride. Good plating resulted at 25° C.

EXAMPLE III

A hydrous oxide colloid was prepared by adding five milliliters of 0.05 molar ammonium hydroxide to 20 milliliters of 0.25 molar copper acetate with good mixing. This colloid, when substituted for the colloid employed in Example I, produced good electroless plating.

EXAMPLE IV

An ABS substrate was prepared using the primer solution of Example II, developed with the developer solution of Example I. An electroless nickel plating was formed by immersion of the substrate at a temperature of 60° C. in an aqueous bath having the following composition:

| | |
|---|---|
| $NiSO_4 \cdot 6H_2O$ | 25 g/l |
| $Na_4P_2O_7 \cdot 10H_2O$ | 50 g/l |
| $NH_4OH$ (conc.) | 15 cc/l |
| Dimethylamine borane | 4 g/l |

EXAMPLE V

One gram of $CoCl_2 \cdot 6H_2O$ was dissolved in 100 ml of deionized water to which 0.5 ml of one molar NaOH was added. The suspension thus formed was heated for 24 hours at 65° C. and then additionally aged at room temperature for six days. Similar colloids were formed with 1.0 ml and 2.0 ml of NaOH being used.

EXAMPLE VI

The procedure of Example V was repeated substituting $NiCl_2 \cdot 6H_2O$ for $CoCl_2 \cdot 6H_2O$.

EXAMPLE VII

ABS substrates were immersed in the colloids of Example V and VI for five minutes at room temperature followed by rinsing and immersion in a developer solution containing 1 g/l $KBH_4$ at pH 8.5 for 2 to 5 minutes to reduce the cobalt and nickel to a lower oxidation state. Subsequent immersion of the plates into an electroless copper bath at 40° C. produced plating in all instances.

EXAMPLE VIII

An ABS substrate was immersed in a colloidal solution formed by adding to 1600 ml of 0.0125 molar copper acetate solution, 400 ml of 0.025 molar $NH_4OH$ dropwise with stirring of the solution. The substrate was thereafter developed and plated in the manner described in Example VII with good results. Successful results were also achieved using a developer solution containing only 0.1 g/l $KBH_4$.

EXAMPLE IX

ABS substrates prepared in accordance with Example VIII were successfully plated utilizing the following electroless nickel bath at pH 6 and a temperature of 25° C.:

| | |
|---|---|
| Ni++ (from a sulfamate concentrate) | 8.0 g/l |
| Dimethylamine borane | 5.0 g/l |

EXAMPLE X

ABS substrates prepared in accordance with Example VIII were also successfully plated utilizing the following electroless cobalt bath at pH 7.6 and 50° C.

| | |
|---|---|
| $CoSO_4 \cdot 7H_2O$ | 25 g/l |
| Disodium succinate $6H_2O$ | 25 g/l |
| Dimethylamine borane | 4 g/l |

EXAMPLE XI

The ABS substrate of Example VIII was also successfully treated using the following developer solutions:
1. Borane-tertbutylamine complex (2 g/l) at 25° C. and 40° C. with immersion time of 5 minutes.
2. Borane morphine complex (2 g/l) at 25° C. and 40° C. with immersion time of 5 minutes.
3. Dimethylamine borane (2 g/l and pH 11 adjusted with NaOH) at 40° C. and immersion time of 5 minutes.

EXAMPLE XII

Four hundred ml of 0.025 molar $NH_4OH$ was added dropwise with stirring to 1600 ml of 0.0125 molar copper acetate to form a colloidal primer solution from which other solutions were prepared and evaluated. The nature of certain surfactants added is shown in parenthesis. The process of evaluation consisted of ABS treatment in colloidal primer, developer at room temperature with a 1 gram liter solution of $KBH_4$ and coating with colloidal copper at 40° C. The following results were obtained:

| Solution | Additive | Conc. | Plating Evaluation after 5 days from Preparation of Control |
|---|---|---|---|
| 1 | NaCl | .01M | positive |
| 2 | NaCOOH | .01M | positive |
| 3 | Tartaric Acid | .01M | positive |
| 4 | Sucrose | .01M | positive |
| 5 | Sodium Lauryl Sulfate (anionic) | .01M | negative |
| 6 | K,Na tartrate | .01M | positive |
| 7 | Na citrate | .001M | negative |
| 8 | Union Carbide Tergitol 15-S-3 (nonionic) | 2ml/l | positive |
| 9 | DuPont Zonyl FSC (cationic) | 2ml/l | negative |
| 10 | Union Carbide - TMN surfactant (nonionic) | 2ml/l | positive |
| 11 | Zonyl FSA (anionic) | 2ml/l | positive |
| 12 | Zonyl FSB (amphoteric) | 2ml/l | negative |
| 13 | Zonyl FSN (nonionic) | 2ml/l | positive |
| 14 | Zonyl FSP (anionic) | 2ml/l | positive |
| 15 | 3M FC 170 (nonionic) | 2ml/l | positive |
| 16 | 3M FC 176 (nonionic) | 2ml/l | positive |
| 17 | none (control) | — | positive |
| 18 | control diluted 10 | — | positive |

It should be noted that the surfactants used in solutions 9, 11–16 are all composed of fluorocarbon chains rather than hydrocarbon chains. Such surfactants have shown good chemical stability in a wide variety of chemical environments.

EXAMPLE XIII

Kapton, a DuPont trademark for polyimide substrates: polyethylene and phenolic substrates were also successfully plated with the control solution of Example XII.

EXAMPLE XIV

The control solution of Example XII was also employed in coating of ABS substrates with the exception that the developer solution was diluted from 1 gr/l to 0.1 gr/l. Successful initiation of electroless plating was noted.

EXAMPLE XV

The control solutions of Example XII were used in coating ABS substrates. The alkalinity of the electroless copper solution was varied, however, from 0.089 to 0.402 molar by the addition of sodium hydroxide. Improvement in the plating uniformity was noted as the alkalinity was increased, probably due to the increased reactivity of the electroless formulation.

EXAMPLE XVI

The procedure of Example XII was followed with the exception that the following electroless copper formulation was used at 50° C.:

| | |
|---|---|
| $CuSO_4 \cdot 5H_2O$ | 10 gr/l |
| NaOH | 10 gr/l |
| Sodium potassium tartarate $\cdot 4H_2O$ | 50 gr/l |
| HCHO (37%) | 20 cc/l |

EXAMPLE XVII

Utilizing the control solutions of Example XII, ABS substrates were immersed in the developer solution for two minute and fifteen minute periods. No major difference in plating results was noted. Successful coating was also obtained using glass (soda lime) substrate instead of the ABS substrate.

EXAMPLE XVIII

Since surfactants are conventionally employed in electroless processes, the following surfactants were added to a 0.05% developer solution of potassium borohydride: Union - Carbide Tergitol TMN and 15-S-3; DuPont Zonyl FSA, FSC and FSN; 3M FC-98, FC-128, FC-170, FC-134 and FC-176 in a concentration range of few mg/liter of developer solution. No improvement in plating uniformity was noted.

EXAMPLE XIX

The following colloidal solutions were prepared by first dissolving 1 gram of $NiCl_2 \cdot 6H_2O$ in 100 ml DI water. In each case, a varied volume of 0.1 M NaOH was added slowly with agitation.

| Case No. | Volume of NaOH added (ml) | Final pH |
|---|---|---|
| 1 | 0.4 | 6.6 |
| 2 | 1.0 | 7.0 |
| 3 | 2.0 | 7.2 |
| 4 | 5.0 | 7.3 |
| 5 | 10.0 | 7.4 |

These solutions were sealed and immersed at 65° C. for 48 hours. Evaluation of the colloidal solutions was undertaken following 48 hours at 65° C. and 3 days of storage at room temperature. The procedure used to evaluate was using standard ABS substrate, immersion in colloidal solution (10 minutes), rinse, immersion in developer ($KBH_4$ 1 gr/l for 5 minutes), rinse, and electroless plating. Using the electroless copper at 40° C., induction time was slow and coverage was incomplete. Using an electroless nickel of the following composition at 45°, results showed improved coverage and a shorter induction time in comparison to the case of copper.

| | |
|---|---|
| $Ni^{++}$ (from a sulfamate Conc.) | 8 g/l |
| DMAB | 5 g/l |
| pH | 5.3 |

The difference in the behavior between nickel and copper is probably due to the fact that in the case of copper the plating process is first dependent upon the successful galvanic reaction between the copper ions in solution and the reduced nickel on the surface.

EXAMPLE XX

The solutions and procedure of Example 13 were followed in testing of the control solution with the exception that sodium borohydride was substituted for potassium borohydride. The developer being adjusted to pH 10.

EXAMPLE XXI

In certain of the preceding examples, the deposition of Ni-B (from baths containing DMAB) onto surfaces treated with a nickel colloid were described. There are, however, economic advantages in depositing Ni-P (derived from solutions containing hypophosphite reducing agents) films. In this example, previously etched ABS substrates were immersed for several minutes in the colloidal nickel solution of Example XIX, case number four, rinsed, and then immersed in one of the following developer formulations for several minutes:

Case 1: 1 g/l $KBH_4$ pH10 at 40° C.
Case 2: 1 g/l $KBH_4$ and 10 g/l $NaH_2PO_2 \cdot H_2O$ at pH 10 at 40° C.
Case 3: 25 g/l $NaH_2PO_2 \cdot H_2O$ at pH 9.1 at 40° C.

After immersion into the developer formulation, the substrates were rinsed and immersed into an electroless nickel bath of the following composition:

| | |
|---|---|
| $Ni^{++}$ (from a sulfamage concentrate) | 8 g/l |
| $NaH_2PO_2 \cdot H_2O$ | 10 g/l |
| pH | 6.3 |
| Temperature | 40° C |

Plating of nickel occurred using the Case 1 and Case 2 developer formulations. No plating took place using the Case 3 developer formulation, however, for reasons which are not presently apparent.

EXAMPLE XXII

A copper colloid which initiated plating directly was prepared according to a procedure suggested by Weiser, "Inorganic Colloid Chemistry", Vol. 1, p. 137. In this preparation, 40 ml of 0.01 M $CuSO_4$ was heated to 80° C. 10 ml of 0.5% $H_3PO_2$ was added during stirring of solution at an approximate rate of 3 ml/min. Etched ABS substrates were immersed in the resulting colloid for 10 minutes, rinsed and directly immersed into the electroless copper solution of Example I at 45° C. Plating was noted to take place.

EXAMPLE XXIII

A colloidal nickel solution was prepared as follows: 25 ml of 0.005 M solution of potassium borohydride was added slowly to a solution composed of 30 ml of 0.0025 M nickel acetate and 0.1 ml of CF-54 surfactant (product of Rohm & Haas). After immersion of the test substrate in the above priming solution, it was found necessary to activate the surface by further immersion in a reducing agent solution (e.g., 1 g/l $KBH_4$). Immersion in the electroless copper bath resulted in good initiation and coverage.

EXAMPLE XXIV

Colloidal cuprous oxide solutions were prepared according to MacFadyon, "J., Colloid and Interface Science" 44, 95 (1973), Run No. 13, Table I. Etched ABS substrates were immersed in the colloidal solutions at 40° C., rinsed developed by immersion in 1 g/l $KBH_4$, and immersed in the electroless copper formulation of Example I. In all cases, good plating was noted.

EXAMPLE XXV

A positively charged colloid of copper was prepared by the thermal aging (18 hours at 75° C.) of a solution composed of $1 \times 10^{-3}$M $CuSO_4$, $2 \times 10^{-3}$M NaOH and $4.0 \times 10^{-3}$M, a cationic surfactant represented by the structure, t-$C_{12}$-$C_{14}$NH$(CH_2CH_2O)_{15}$H, with a final pH of 5.2. Using the above colloid with ABS at 40° C. with 1.5 g/l $KBH_4$ (5 minutes) and the electroless copper bath of Example I, good initiation and plating took place.

EXAMPLE XXVI

A negatively charged colloid of copper was prepared by the thermal aging (18 hours at 75° C.) of a solution composed of $1 \times 10^{-3}$M $CuSO_4$, $2 \times 10^{-3}$M NaOH and $4.0 \times 10^{-3}$M sodium lauryl sulfate with a final pH of 9.8. Using ABS with the above procedure and compositions, no plating took place.

EXAMPLE XXVII

A colloidal hydrous oxide solution of nickel was prepared in a similar fashion to Example XXV above with a final pH of 7.6. This colloidal solution was used at 40° C. followed by a developer solution (1.5 g/l KBH$_4$) with 5 minutes immersion time. The electroless nickel bath was similar to that of Example XXI except for the lowering of the nickel content to 5.5 g/l. Good plating was noted here as well as in the electroless copper of Example I. Preparing an hydrous oxide colloid of nickel similar to that of Example XXVI with a final pH of 11.3 did not yield effective plating with nickel under the conditions and procedure employed. It was also found that cobalt colloids were prepared in a similar fashion as the nickel ones.

EXAMPLE XXVIII

Colloidal catalytic hydrous oxides of copper and nickel were prepared by aging (18 hours at 75° C.) solutions composed of $9 \times 10^{-4}$M NiSO$_4$, $1 \times 10^{-4}$M CuSO$_4$, $2 \times 10^{-3}$M NaOH and $4 \times 10^{-3}$M of the cationic surfactant of Example XXV with a final pH of 4.4. Using above binary colloidal solution at 40° C. and a developer solution (1.5 g/l KBH$_4$, 5 minutes) with a commercial electroless copper bath (Sel-Rex Oxytron Cu #990) at 31° C. gave good plating results; however, using the single colloids under the same conditions did not produce as good quality plating coverage. It was also found that due to the apparent greater activity of the catalytic surface, reduced concentrations of developer solutions may be used in conjunction with the electroless copper of Example I. It is recognized that cobalt may be substituted for nickel.

EXAMPLE XXIX

Ferric and chromium hydrous oxide colloids were prepared by aging at 75° C. for 18 hours the following compositions: $1 \times 10^{-3}$M FeCl$_3$, $2 \times 10^{-3}$M NaOH and $4 \times 10^{-3}$M of the cationic surfactant of Example XXV with a final pH=10.5; and $1 \times 10^{-3}$M Cr(NO$_3$)$_3$, $2 \times 10^{-3}$M NaOH and $4 \times 10^{-3}$M surfactant with a final pH=4.2. These primer solutions used at 40° C. with 1.5 g/l KBH$_4$ and electroless copper bath (of Example I) at 40° C. showed some evidence of plating on ABS substrate, and it should be recognized that increasing the developer concentration, or the colloid concentration, or both, could also bring the conditions for plating to an optimum.

In the primer solution and the ferric and chromium ions are adsorbed onto the substrate and then reduced to the zero oxidation state when immersed in the developer solution. After the developer solution the substrate is then immersed in the electroless copper bath. It is believed in this solution a replacement mechanism occurs in which the copper replaces the iron (or chromium) on the substrate (e.g., $Cu^{+2} + Fe° \rightarrow Cu°$) after which electroless initiation about the copper (Cu°) sites takes place. It is this replacement reaction which has been illustrated here in the previous example. It should be noted that this is only an example of the initiation mechanism and that any metal which will work for this mechanism falls within the contemplation of the present invention. Such metals are those having a more negative reduction potential than copper. Typical metals which fall into this category for use with electroless copper baths are iron, zinc and cromium.

Accordingly, any metallic nuclei which is more active with respect to copper ions or nickel ions contained within the electroless formulation could be a candidate with said metal nuclei derived from the adsorption of colloidal of hydrous oxide and its reduction prior to the electroless plating step.

EXAMPLE XXX

Several colloidal solutions of copper ($5 \times 10^{-2}$M) were prepared and aged with a final pH of 9. In this series of solutions the surfactant, sodium salt of Lauryl sulfate, was varied in the molar ratio to copper from ¼ to 3 times. Using etched ABS and 0.5 g/l KBH$_4$ effective plating took place using the electroless copper of Example I.

EXAMPLE XXXI

Hydrous oxide copper colloids were prepared similarly to Example XXX with the addition singularly of the following additives:

| | |
|---|---|
| Gum Arabic | 4 mg/l |
| Ethylene Glycol | 25 ml/l |
| Polyethylene Glycol (M. W. average 1000) | 0.025 molar |
| Tannic Acid | $5 + 10^{-3}$ molar |
| Glycerol | 25 ml/l |

Effective colloids were formed.

As noted in Example XXIX, hydrous oxide colloids of metals other than copper, nickel and cobalt may be employed in the practice of the present invention. Substrates treated with such colloids, however, when immersed in an electroless plating bath, must first undergo a replacement reaction between a portion of the metal on the surface and the metal ions e.g., copper, in the electroless bath before the surface is catalytic. This initial replacement reaction not only renders the process slower, and thus less commercially desirable, but increases the number of interfaces between the dielectric substrate and the outer plating.

In this latter regard, it is recognized in the prior art that an increase in the number of interfaces may decrease the adherence of the overall coating i.e. the overall process reliability. In the present invention, when using the preferred hydrous oxide colloids of copper, nickel or cobalt, only one layer is present between the dielectric substrate and electroless coating. In conventional tin/palladium systems, however, two intermediate layers are present.

In the practice of the present invention, an increase in the reactivity of the colloidal primers has been found to permit a decrease in the reactivity of the developer solutions. The latter may be modified by changes in the concentration of the reducing agent used and/or changing the nature of the agent used. Methods for increasing colloidal reactivity may include concentration, temperature, particle size and charge modifications. The ability to use developers of lower reactivity is a significant cost savings and means for the use of less expensive reducing agents.

The present invention is also effective in the formation of selective images on dielectric substrates, e.g., in the manufacture of printed circuits, utilizing cuprous oxide colloidal solutions by a process comprised of the following steps:

(1) Coating a dielectric substrate with a solution of a cuprous oxide colloid;

(2) Rinsing the substrate to remove excess colloid;

(3) Partially drying the substrate;

(4) Exposing selected portions of the substrate to actinic radiation;

(5) Contacting the exposed substrate with an electroless plating bath to form a real image and;

(6) Optionally, plating the substrate by electrolytic means.

It should also be recognized that while a specific colloidal media may be effective on one substrate, this does not provide an assurance that same would work on other substrate(s). A typical case encountered is the treatment of etched ABS and Noryl substrates. The difference in behavior is presumably due to the difference in the surface charge of these etched surfaces. It should also be recognized that this difference in behavior is not new and has been encountered in this art in using the colloidal catalytic solution based upon the admixture of acidic stannous chloride and palladium.

In the art of plating of plastics and printed circuits, all surfaces (e.g. etched ABS vs. Noryl) do not have the same surface charge. It is thus obvious to those skilled in the art that the priming colloidal catalytic media must be applicable to all surfaces and not be limited to a few. It should be obvious to those skilled in the art that a system containing aqueous solutions of metallic salts (e.g., $CuSO_4$) could not be effective on all surfaces which differ in the sign of their surface charge. It is thus the purpose of this invention to provide with priming solutions which would be applicable to all substrates of commercial interest independent of their surface charge. It should thus be recognized that the application of the primer colloidal solutions and the ability to charge said colloid in a desired fashion thus permits effective adsorption on desired surfaces without limitation to specific subtrates.

It should also be obvious that various approaches may be taken in the charging of such colloids, e.g., controlled addition of compound with specific anions such as hydroxl ions and/or controlled addition of suitable surfactants and/or secondary colloids. It should also be recognized that depending upon the nature of surfactant being added, a reversal in charge may take place; this behavior depends upon the nature of the surfactant used (e.g., cationic vs. anionic, etc.)

It should be noted that the immersion times given in the examples are tailored for the etched standard ABS substrates used (Lustran PG 299 Grey Product of Monsanto Co.). Substitution of other dielectric substrates may require alteration in the immersion times based upon the absorption rate of the colloids. This optimum immersion time could be determined by simple experimental procedure.

It will be obvious to the skilled artisan that certain conditions normally observed in electroless coating technology should also be observed in the practice of the present invention. For example, the catalytic specie(s) present on the surface must interact with the reducing agent(s) present in the electroless plating bath. In this respect it is well known in the art that Ni-P type deposits (derived from hypophosphite containing baths) do not self initiate upon copper surfaces; however, Ni-B type deposits (derived from dimethylamine borane containing baths) do initiate on same copper surface. The difference encountered is due to the choice of the reducing agent present. It is further possible that the initiation of the plating process takes place first via a galvanic replacement type reaction of the metallic ions in solution with the catalytic surface. A typical example is the immersion of a copper substrate into an electroless gold plating formulation. Furthermore, in choosing a specific electroless formulations, it is essential to know that none of the components present (complexing agents, pH adjuster, stabilizers, etc.) in the electroless formulation is capable of deactivating the catalytic surface either by dissolution or other mechanism and thus compatible electroless formulations should be selected.

While it is stated in this application that one should use compatible electroless plating formulations, this restriction is eliminated according to findings covered under a separate application.

It will be obvious upon a reading of the preceeding description that the processes of the invention are especially useful in printed circuitry fabrication encompassing fully additive methods, semiadditive methods, and substractive with through-hole metallization.

It will be further obvious to one skilled in the pertinent art that many modifications and variations may be made in the preceding description without departing from the spirit and scope of the present invention. For example, it will be apparent that mixtures of reducing agents may be used in a single developer solution or may be used in successive steps. Furthermore, it is within the scope of the present invention to delete the use of a separate developer solution by directly immersing the primed substrate in an electroless plating formulation containing one or more reducing agents capable of reducing the oxidation state of the primed surface.

I claim:

1. An improved process for the preparation of nonconductor substrates for electroless metal or alloy plating thereon comprising contacting said substrate with a catalytic non-precious metal colloidal composition wherein said catalytic non-precious metal is the admixture of copper and at least one metal selected from the group consisting of nickel, cobalt, and iron and wherein said colloidal composition is formed by interaction of the metal ions with a precipitating agent and wherein said precipitating agent is selected from the group of hypophosphorus acid and its derivatives and hydroxyl ions.

2. The process according to claim 1 wherein the colloidal composition further contains a colloidal stabilizer.

3. The process according to claim 1 wherein the catalytic non-precious metal is part of an alloy.

4. The process according to claim 1 wherein the catalytic non-precious metal is in an elemental state.

5. The process according to claim 1 further containing the step of activation thereby activating the catalytic sites towards electroless plating wherein said activation comprises a reducing composition.

6. The process according to claim 1 wherein said colloidal composition is derived by the dispersion of a powder in a suitable solvent medium.

7. The process according to claim 1 wherein said colloidal composition further containing a mild reducing agent.

8. An improved process for the metallization of nonconductor substrate by electroless plating thereon comprising (a) contacting said substrate with a colloidal composition said composition comprised of a colloid of a catalytic non-precious metal wherein said metal is higher in the EMF series in comparison to said platable metal ion present in the electroless bath with said colloid reduced after the substrate has been treated to a lower or elemental state prior to the electroless plating build-up, and b) plating from an electroless bath comprising said platable metal ion.

9. The process according to claim 8 wherein said colloidal catalytic composition further contains a colloid stabilizer.

10. The process according to claim 8 wherein said colloidal catalytic composition further containing a mild reducing agent.

11. The process according to claim 8 wherein said colloidal catalytic composition is derived by the dispersion of a powder in a suitable medium.

12. An improved process of electroless metal deposition of dielectric substrates comprising the steps of,
(A) Coating the surface of the substrate with colloid of at least one non-precious elemental metal wherein said elemental metal is selected from the group consisting of copper, cobalt, iron and nickel and mixtures thereof, and
(B) Immersing the substrate in an electroless plating composition.

13. The process recited in claim 12 including the step of activating the substrate by reduction subsequent to coating.

14. The process according to claim 12 wherein said colloid further containing a mild reducing agent.

15. The process according to claim 12 wherein said colloid is derived by the dispersion of a powder in a suitable medium.

16. An improved process for electroless plating of a non-conductor substrate comprising
(a) contacting the non-conductor with a colloidal catalytic composition of non-noble elemental metal and/or alloy thereof wherein said metal is catalytic for electroless metal initiation and further wherein said composition was previously contacted with water and air; and subsequently (b) contacting the treated non-conductor with a composition comprising a reducing agent capable of interacting with the treated non-conductor and thereby rendering said non-conductor active for electroless build-up.

17. The process according to claim 16 wherein said non-noble metal is selected from the group consisting of copper, cobalt, nickel and iron, mixtures and alloys thereof.

18. The process according to claim 16 wherein said reducing agent is part of the electroless plating bath.

19. The process according to claim 16 wherein said non-conductor substrate is ABS.

20. The process according to claim 16 wherein said electroless build-up is carried forth utilizing an electroless copper composition.

21. The process according to claim 16 wherein said colloidal composition further contains at least one colloid stabilizer.

22. The process according to claim 16 wherein said colloidal catalytic composition comprises negative colloids.

23. The process according to claim 16 wherein said colloidal catalytic composition comprises positive colloids.

24. The process according to claim 16 wherein said colloidal composition is prepared by a chemical precipitation method.

25. The process according to claim 16 wherein said colloidal composition was prepared by the admixing of a soluble metal compound comprising a catalytic metal along with a reducing agent capable of homogeneous reduction of the metal ions within said metal compound to a lower oxidation state.

26. The process according to claim 16 wherein said catalytic composition further containing a mild reducing agent.

27. The process according to claim 16 wherein said catalytic composition is derived by the dispersion of a powder in a suitable medium.

28. An improved process for the preparation of non-conductor substrates prior to electroless metal deposition comprising the steps of:
a. Coating the surface of the substrate with a colloidal composition comprising cuprous oxide, and
b. Contacting the coated surface with a composition comprising a reducing agent capable of reducing the cuprous oxidation state to the metallic state.

29. An improved process for the preparation of non-conductor substrates for electroless plating thereon comprising the contacting of said substrate with a colloidal catalytic composition, said composition comprised of a colloid of a catalytic non-precious metal compound wherein said metal is higher in the EMF series in comparison to said platable metal ion(s) present in the electroless bath, and wherein said non-precious metal compound of said colloid is reduced to a lower or elemental state prior to the electroless plating build-up and wherein said colloidal composition is derived by the dispersion of a powder in a suitable medium.

30. An improved process for electroless plating a non-conductor substrate comprising the steps of
(a) contacting the non-conductor with a stabilized colloidal composition of non-noble metal selected from the group comprising hydrous oxides, metals and alloys and mixtures thereof and wherein said metal is catalytic for electroless plating initiation and further wherein said composition is derived by the dispersion of a powder in a suitable medium and is further permitted to be contacted with water and air, and
(b) contacting the treated non-conductor with a composition comprising a reducing agent capable of interacting with the treated non-conductor and thereby rendering said non-conductor active for electroless build-up.

31. The process according to claim 30 wherein said colloidal composition comprises positive colloids.

32. The process according to claim 30 wherein said colloidal composition comprises negative colloids.

33. An improved process for preparing dielectric substrates for electroless plating comprising
a. coating the surface of a dielectric substrate to be plated with a hydrous oxide colloid of a non-precious metal selected from the group consisting of cobalt, iron, nickel and copper and alloys of said metals, and mixtures thereof, and at least one colloid stabilizer, and
b. reducing said metal to a lower or zero valence state with a chemical reducing agent to effect a catalytic surface receptive to electroless plating initiation.

34. The process of claim 33 wherein said reducing agent is selected from the group consisting of dimethylamine borane, diethylhydroxylamine, N-alkyl-borozones, N-alkyl-borozoles, borozenes, borozines, and mixtures thereof.

35. The process of claim 33 wherein said reducing agent is selected from the group consisting of the alkali metal and alkaline earth metal borohydrides.

36. The process of claim 33, wherein said dielectric substrate is coated by immersion in a bath of said hydrous oxide colloid.

37. The process of claim 33, wherein said metal is reduced by immersion of said dielectric substrate into aqueous bath of said reducing agent.

38. The process of claim 33, wherein said dielectric substrate is ABS.

39. The process of claim 33 wherein said dielectric substrate is etched prior to coating.

40. An improved process for the electroless plating of dielectric substrates comprising
   a. coating the surface of a dielectric substrate with a hydrous oxide colloid of a non-precious metal selected from the group consisting of copper, nickel, iron and cobalt and alloys of said metals, and mixtures thereof and further containing at least one colloid stabilizer;
   b. reducing the valence state of said metal to effect a catalytic surface receptive to electroless plating; and
   c. contacting the catalytic surface with an electroless plating bath.

41. The process of claim 40, wherein said dielectric substrate is etched prior to coating.

42. The process of claim 40, wherein the valence state of said metal is reduced with a reducing agent selected from the group consisting of dimethylamine borane, diethylhydroxylomine, N-alkyl-borazones, N-alkyl-borazoles, borazenes, borazines, and mixtures thereof.

43. The process of claim 40, wherein the valence state of said metal is reduced with a reducing agent selected from the group consisting of the alkali metal and alkaline earth metal borohydrides.

44. The process of claim 40, wherein said dielectric substrate is ABS.

45. An improved process for preparing dielectric substrates for electroless plating comprising
   a. coating the surface of a dielectric substrate to be plated with a hydrous oxide colloid of a non-precious metal selected from the group consisting of cobalt, iron, nickel and copper and alloys of said metals, and mixtures thereof and at least one colloid stabilizer;
   b. rinsing said substrate to remove excess colloid; and
   c. reducing said metal to a lower or zero valence state with a chemical reducing agent to render the surface catalytic for electroless plating.

* * * * *

UNITED STATES PATENT AND TRADEMARK OFFICE
CERTIFICATE OF CORRECTION

PATENT NO. : 4,136,216

DATED : January 23, 1979

INVENTOR(S) : Nathan Feldstein

It is certified that error appears in the above—identified patent and that said Letters Patent is hereby corrected as shown below:

Col. 2 line 29, after "521,901," insert --which is incorporated herein by reference,--.

Col. 2 line 57, after "feasible" insert --,--.

Col. 4 line 7, delete "*Advance*" and insert --*Advanced*--.

Col. 4 line 37, after "after" delete "centrigugation" and insert --centrifugation--.

Col. 4 line 39, after "a" delete "media" and insert --medium--.

UNITED STATES PATENT AND TRADEMARK OFFICE
CERTIFICATE OF CORRECTION

PATENT NO. : 4,136,216                    Page 2 of 4
DATED : January 23, 1979
INVENTOR(S) : Nathan Feldstein It is certified that error appears in the above—identified patent and that said Letters Patent is hereby corrected as shown below:

Col. 4 line 46, after "stabilizers" delete "." and insert --,--.

Col. 4 line 47, delete "The" and insert --the--.

col. 4 line 53, after "serve" delete "the" and insert --to--.

Col. 4 line 57, after "gum arabic," delete "gelatine" and insert --gelatin--.

Col. 4 line 57, after "starch," delete "albumim" and insert --albumin--.

Col. 5 line 20, after "the" delete "alkail" and insert --alkali--.

Col. 5 line 30, delete "discontinous" and insert --discontinuous--

Col. 8 line 60, delete "tartarate" and insert --tartrate--.

Col. 9 line 55, after "developer" delete "being" and insert --was--.

Col. 10 line 10, after "from a" delete "sulfamage" and insert --sulfamate--.

Col. 11 line 52, after "solution" delete "and".

Col. 12 line 2, after "and" delete "cromium" and insert

UNITED STATES PATENT AND TRADEMARK OFFICE
CERTIFICATE OF CORRECTION

PATENT NO. : 4,136,216

DATED : January 23, 1979

INVENTOR(S) : Nathan Feldstein

It is certified that error appears in the above—identified patent and that said Letters Patent is hereby corrected as shown below:

--chromium--.

Col. 12 line 3, after "metallic" delete "nuclei" and insert --nucleus--.

Col. 13 line 14, after "colloidal" delete "media" and insert --medium--.

Col. 13 line 27, after "catalytic" delete "media" and insert --medium--.

Col. 14 line 8, after "electroless" delete "formulations" and insert --formulation--.

Col. 14 line 63, after "further" delete "containing" and insert --contains--.

UNITED STATES PATENT AND TRADEMARK OFFICE
CERTIFICATE OF CORRECTION

PATENT NO. : 4,136,216
DATED : January 23, 1979
INVENTOR(S) : Nathan Feldstein

It is certified that error appears in the above—identified patent and that said Letters Patent is hereby corrected as shown below:

Col. 15 line 8, after "and" delete "b)" and insert --(b)--.

Col. 15 line 15, after "further" delete "containing" and insert --contains--.

Col. 15 line 33, after "further" delete "containing" and insert --contains--.

Col. 16 line 11, after "further" delete "containing" and insert --contains--.

Col. 16 line 36, after "for" delete "electroless" and insert --electrolessly--.

Signed and Sealed this

Thirtieth Day of June 1981

[SEAL]

Attest:

RENE D. TEGTMEYER

Attesting Officer

Acting Commissioner of Patents and Trademarks